US010996652B2

(12) United States Patent
Chin et al.

(10) Patent No.: US 10,996,652 B2
(45) Date of Patent: May 4, 2021

(54) ADAPTIVE 3D PRINTING

(71) Applicant: Desktop Metal, Inc., Burlington, MA (US)

(72) Inventors: Ricardo Chin, Burlington, MA (US); Michael A. Gibson, Boston, MA (US); Blake Z. Reeves, Burlington, MA (US); Shashank Holenarasipura Raghu, Burlington, MA (US)

(73) Assignee: Desktop Metal, Inc., Burlington, MA (US)

( * ) Notice: Subject to any disclaimer, the term of this patent is extended or adjusted under 35 U.S.C. 154(b) by 0 days.

(21) Appl. No.: 15/959,063

(22) Filed: Apr. 20, 2018

(65) Prior Publication Data
US 2018/0307209 A1    Oct. 25, 2018

Related U.S. Application Data

(60) Provisional application No. 62/488,268, filed on Apr. 21, 2017.

(51) Int. Cl.
*G05B 19/4099* (2006.01)
*B22F 1/00* (2006.01)
(Continued)

(52) U.S. Cl.
CPC ........ *G05B 19/4099* (2013.01); *B22F 1/0059* (2013.01); *B22F 3/008* (2013.01); *B22F 3/1055* (2013.01); *B22F 3/24* (2013.01); *B29C 64/386* (2017.08); *G06F 30/17* (2020.01); *B22F 2003/1057* (2013.01);
(Continued)

(58) Field of Classification Search
USPC .......................................................... 700/98
See application file for complete search history.

(56) References Cited

U.S. PATENT DOCUMENTS

2014/0107823 A1    4/2014  Huang
2015/0021830 A1*   1/2015  Yerazunis .............. B33Y 10/00
                                                         264/401
(Continued)

OTHER PUBLICATIONS

Prevost—Make it Stand: Balancing Shapes for 3D Fabrication. ACM Trans. Graph. 32, 4, Article 81 (Jul. 2013) DOI 10.1145/2461912.2461957 (Year: 2013).*
(Continued)

*Primary Examiner* — Ziaul Karim
*Assistant Examiner* — Joshua T Sanders
(74) *Attorney, Agent, or Firm* — Wiggin and Dana LLP; Jonathan D. Hall; Joseph Casino

(57) ABSTRACT

Methods provide for fabricating objects through additive manufacturing in a manner that compensates for deformations introduced during post-print processing, such as sintering. An initial model may be divided into a plurality of segments, the initial model defining geometry of an object. For each of the segments, modified geometry may be calculated, where the modified geometry compensates for a predicted deformation. Print parameters can then be updated to incorporate the modified geometry, where the print parameters define geometry of the printed object (e.g., configuration settings of the printer, a tool path, an object model). The object may then be printed based on the updated print parameters.

18 Claims, 7 Drawing Sheets

(51) Int. Cl.
*B22F 3/24* (2006.01)
*B22F 3/105* (2006.01)
*B29C 64/386* (2017.01)
*B22F 3/00* (2021.01)
*G06F 30/17* (2020.01)
*B33Y 50/02* (2015.01)
*G06T 17/20* (2006.01)
*B33Y 10/00* (2015.01)
*B33Y 50/00* (2015.01)

(52) U.S. Cl.
CPC ..... *B22F 2003/247* (2013.01); *B22F 2301/00* (2013.01); *B33Y 10/00* (2014.12); *B33Y 50/00* (2014.12); *B33Y 50/02* (2014.12); *G06T 17/20* (2013.01)

(56) References Cited

U.S. PATENT DOCUMENTS

| | | |
|---|---|---|
| 2015/0352794 A1 | 12/2015 | Nguyen et al. |
| 2016/0243644 A1 | 8/2016 | Moneta et al. |
| 2016/0246908 A1* | 8/2016 | Komzsik ................. G06T 17/20 |
| 2016/0320771 A1 | 11/2016 | Huang |
| 2018/0321659 A1* | 11/2018 | Dasappa ................. G06F 17/50 |

OTHER PUBLICATIONS

International Search Report and Written Opinion for International Appl. No. PCT/US2018/028676, entitled "Adaptive 3D Printing," consisting of 13 pages. dated Jul. 12, 2018.

\* cited by examiner

ADAPTIVE 3D PRINTING

RELATED APPLICATION

This application claims the benefit of U.S. Provisional Application No. 62/488,268, filed on Apr. 21, 2017. The entire teachings of the above application are incorporated herein by reference.

BACKGROUND

Metal injection molding (MIM) is a metalworking process useful in creating a variety of metal objects. A mixture of powdered metal and binder (e.g., a polymer such as polypropylene) forms a "feedstock" capable of being molded, at a high temperature, into the shape of a desired object. The initial molded part, also referred to as a "green part," then undergoes a debinding process to remove the binder, followed by a sintering process. During sintering, the part is brought to a temperature near the melting point of the powdered metal, which evaporates any remaining binder and forming the metal powder into a solid mass, thereby producing the desired object.

Additive manufacturing, also referred to as 3D printing, includes a variety of techniques for manufacturing a three-dimensional object via an automated process of forming successive layers of the object. 3D printers may utilize a feedstock comparable to that used in MIM, thereby creating a green part without the need for a mold. The green part may then undergo comparable debinding and sintering processes to produce the object.

SUMMARY

Example embodiments provide for fabricating objects through additive manufacturing, as well as for configuring an additive manufacturing system. In one embodiment, a model may be divided into a plurality of segments, the initial model defining a geometry of an object. For each of the plurality of segments, a predicted deformation of the segment may be calculated based on a predicted deformation of the geometry of the object between a printed state and a finished state. For each of the plurality of segments, a modified geometry of the segment may be calculated as a function of the predicted deformation, the modified geometry compensating for the predicted deformation of corresponding portions of the printed object. Print parameters of the object may then be updated to incorporate the modified geometry, the print parameters defining a printed geometry of the object.

In further embodiments, the object may be printed based on the updated print parameters. For each of the plurality of segments, a stress value may be calculated representing a predicted measure of stress applied to a corresponding portion of a printed object, the stress value being calculated as a function of a cross-sectional area of the segment and a mass of segments located above the segment. For each of the plurality of segments, a modified geometry of the segment may be calculated as a function of the stress value, the modified geometry compensating for a predicted deformation of the corresponding portion of the printed object as a result of the stress. The stress value may be calculated as a function of a location of a center of gravity of segments located above the segment.

Updating the print parameters may include generating a correction model of the object, the correction model defining the printed geometry of the object with modifications to the initial model based on the modified geometry. The predicted deformation may be based on a predicted deformation of the object during a sintering process, a predicted deformation of the object during a debinding process, a predicted anisotropic distortion due to anisotropy in a material composition of the object in the printed state, and/or a predicted gravitational force on the object during a sintering process (e.g., in a debinded state, and/or during a bulk sintering process). The predicted deformation may also be based on a predicted deformation caused by at least one artifact exhibited by print patterns of a printed object, a predicted deformation of the segment based on a predicted gravitational force on the object, and/or a predicted difference between shrinkage of an outer layer of the object and shrinkage of an interior of the object during a sintering process. A modified geometry of a support structure may be calculated as a function of the predicted deformation, the support structure being printed concurrently with the object and being positioned beneath at least a portion of the object.

A further embodiment may include a method of manufacturing an object. A model may be divided into a plurality of segments, the initial model defining a geometry of an object. For each of the plurality of segments, a predicted deformation of the segment may be calculated based on a predicted deformation of the geometry of the object between a printed state and a finished state. For each of the plurality of segments, a modified geometry of the segment may be calculated as a function of the predicted deformation, the modified geometry compensating for the predicted deformation of corresponding portions of the printed object. Print parameters of the object may then be updated to incorporate the modified geometry, the print parameters defining a printed geometry of the object. The object may then be printed based on the updated print parameters. Following printing, the printed object may then be sintered, the sintering causing the part to transform toward a geometry corresponding to the geometry of the object.

In a further embodiment, an initial model may be divided into a plurality of segments, the initial model defining geometry of an object. For each of the segments a stress value may be calculated. The stress value may represent a predicted measure of stress applied to a corresponding portion of a printed object, and may be calculated as a function of a cross-sectional area of the segment and a mass of segments located above the segment. A modified geometry of each segment may then be calculated as a function of the stress value. The modified geometry may compensate for a predicted deformation of the segment as a result of the anticipated stress on the corresponding segment of the printed object. Print parameters may then be updated to incorporate the modified geometry, where the print parameters define geometry of the printed object (e.g., configuration settings of the printer, a tool path, an object model). The object may then be printed based on the updated print parameters.

In further embodiments, updating the print parameters may include generating a correction model of the object, where the correction model defines the geometry of the printed object with modifications to the initial model based on the modified geometry. Further, the stress value may be calculated as a function of a location of a center of gravity of segments located above the segment.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
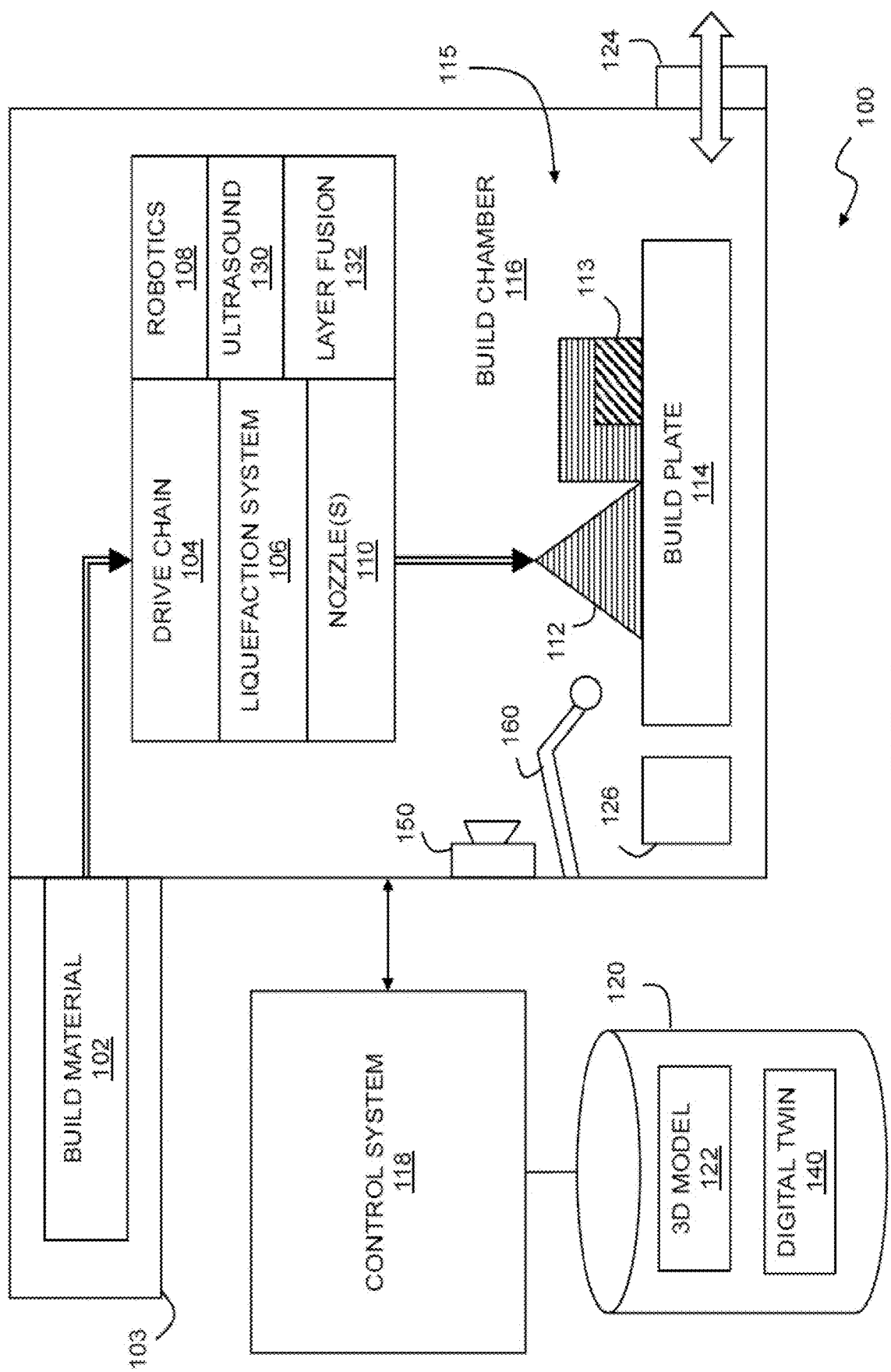
FIG. 1 is a block diagram of an additive manufacturing system.

FIG. 1 is a block diagram of an additive manufacturing system for use with composites. The additive manufacturing system may include a three-dimensional printer 100 (or simply printer 100) that deposits metal using fused filament fabrication. Fused filament fabrication is well known in the art, and may be usefully employed for additive manufacturing with suitable adaptations to accommodate the forces, temperatures and other environmental requirements typical of the metallic injection molding materials described herein. In general, the printer 100 may include a build material 102 that is propelled by a drive train 104 and heated to a workable state by a liquefaction system 106, and then dispensed through one or more nozzles 110. By concurrently controlling robotic system 108 to position the nozzle(s) along an extrusion path, an object 112 may be fabricated on a build plate 114 within a build chamber 116. In general, a control system 118 manages operation of the printer 100 to fabricate the object 112 according to a three-dimensional model using a fused filament fabrication process or the like.

A variety of commercially available compositions have been engineered for metal injection molding ("MIM"). These highly engineered materials can also be adapted for use as a build material 102 in printing techniques such as fused filament fabrication. For example, MIM feedstock materials, when suitably shaped, may be usefully extruded through nozzles typical of commercially available FFF machines, and are generally flowable or extrudable within typical operating temperatures (e.g., 160-250 degrees Celsius) of such machines. This temperature range may depend on the binder—e.g., some binders achieve appropriate viscosities at about 205 degrees Celsius, while others achieve appropriate viscosities at lower temperatures such as about 160-180 C degrees Celsius. One of ordinary skill will recognize that these ranges (and all ranges listed herein) are provided by way of example and not of limitation. Further, while there are no formal limits on the dimensions for powder metallurgy materials, parts with dimensions of around 100 millimeters on each side have been demonstrated to perform well for FFF fabrication of net shape green bodies. Any smaller dimensions may be usefully employed, and larger dimensions may also be employed provided they are consistent with processing dimensions such as the print resolution and the extrusion orifice diameter. For example, implementations target about a 0.300 µm diameter extrusion, and the MIM metal powder may typically be about 1~22 µm diameter, although nano sized powders can be used. The term metal injection molding material, as used herein, may include any such engineered materials, as well as other fine powder bases such as ceramics in a similar binder suitable for injection molding. Thus, where the term metal injection molding or the commonly used abbreviation, MIM, is used, the term may include injection molding materials using powders other than, or in addition to, metals and, thus, may include ceramics. Also, any reference to "MIM materials," "powder metallurgy materials," "MIM feedstocks," or the like may generally refer to metal powder and/or ceramic powder mixed with one or more binding materials, e.g., a backbone binder that holds everything together and a bulk binder that carries the metal and backbone into position within a mold or print. Other material systems may be suitable for fabricating metal parts using fabrication techniques such as stereolithography or binder jetting, some of which are discussed in greater detail below. Such fabrication techniques may, in some applications, be identical to techniques for fabricating parts from ceramic material.

In general, fabrication of such materials may proceed as with a conventional FFF process, except that after the net shape is created, the green part may be optionally machined or finished while in a more easily workable state, and then debound and sintered into a final, dense object using any of the methods common in the art for MIM materials. The final object, as described above, may include a metal, a metal alloy, a ceramic, or another suitable combination of materials.

The build material 102 may be fed from a carrier 103 configured to dispense the build material to the three-dimensional printer either in a continuous (e.g., wire) or discrete (e.g., billet) form. The build material 102 may for example be supplied in discrete units one by one as billets or the like into an intermediate chamber for delivery into the build chamber 118 and subsequent melt and deposition. In another aspect, the carrier 103 may include a spool or cartridge containing the build material 102 in a wire form. Where a vacuum or other controlled environment is desired, the wire may be fed through a vacuum gasket into the build chamber 118 in a continuous fashion, however, typical MIM materials can be heated to a workable plastic state under normal atmospheric conditions, except perhaps for filtering or the like to remove particles from the build chamber 116. Thus in one aspect, there is described herein an apparatus including a MIM build material formed into a wire, the build material including an engineered composite of metal powder and a polymeric binder or the like, wherein the carrier 103 is configured to dispense the build material in a continuous feed to a three-dimensional printer. For environmentally sensitive materials, the carrier 103 may provide a vacuum environment for the build material 102 that can be directly or indirectly coupled to the vacuum environment of the build chamber 118. More generally, the build chamber 118 (and the carrier 103) may maintain any suitably inert environment for handling of the build material 102, such as a vacuum, and oxygen-depleted environment, an inert gas environment, or some gas or combination of gasses that are not reactive with the build material 102 where such conditions are necessary or beneficial during three-dimensional fabrication.

A drive train 104 may include any suitable gears, compression pistons, or the like for continuous or indexed feeding of the build material 116 into the liquefaction system 106. In one aspect, the drive train 104 may include gear shaped to mesh with corresponding features in the build material such as ridges, notches, or other positive or negative detents. In another aspect, the drive train 104 may use heated gears or screw mechanisms to deform and engage with the build material. Thus there is described in one aspect a printer for a fused filament fabrication process that heats a build material to a working temperature, and that heats a gear that engages with, deforms, and drives the composite in a feed path. A screw feed may also or instead be used.

For more brittle MIM materials, a fine-toothed drive gear of a material such as a hard resin or plastic may be used to grip the material without excessive cutting or stress concentrations that might otherwise crack, strip, or otherwise compromise the build material.

In another aspect, the drive train 104 may use bellows, or any other collapsible or telescoping press to drive rods, billets, or similar units of build material into the liquefaction system 106. Similarly, a piezoelectric or linear stepper drive may be used to advance a unit of build media in a non-continuous, stepped method with discrete, high-powered mechanical increments. In another aspect, the drive train 104 may include multiple stages. In a first stage, the drive train 104 may heat the composite material and form threads or other features that can supply positive gripping traction into the material. In the next stage, a gear or the like matching these features can be used to advance the build material along the feed path. A collet feed may be used (e.g., similar to those on a mechanical pencil). A soft wheel or belt drive may also or instead be used. In an aspect, a shape forming wheel drive may be used to ensure accuracy of size and thus the build. More generally, the drive train 104 may include any mechanism or combination of mechanisms used to advance build material 102 for deposition in a three-dimensional fabrication process.

The liquefaction system 106 may be any liquefaction system configured to heat the composite to a working temperature in a range suitable for extrusion in a fused filament fabrication process. Any number of heating techniques may be used. In one aspect, electrical techniques such as inductive or resistive heating may be usefully applied to liquefy the build material 102. This may, for example include inductively or resistively heating a chamber around the build material 102 to a temperature at or near the glass transition temperature of the build material 102, or some other temperature where the binder or other matrix becomes workable, extrudable, or flowable for deposition as described herein. Where the contemplated build materials are sufficiently conductive, they may be directly heated through contact methods (e.g., resistive heating with applied current) or non-contact methods (e.g., induction heating using an external electromagnet to drive eddy currents within the material). The choice of additives may further be advantageously selected to provide bulk electrical characteristics (e.g., conductance/resistivity) to improve heating. When directly heating the build material 102, it may be useful to model the shape and size of the build material 102 in order to better control electrically-induced heating. This may include estimates or actual measurements of shape, size, mass, etc.

In the above context, "liquefaction" does not require complete liquefaction. That is, the media to be used in printing may be in a multi-phase state, and/or form a paste or the like having highly viscous and/or non-Newtonian fluid properties. Thus the liquefaction system 106 described herein may include, more generally, any system that places a build material 102 in condition for use in fabrication as described herein.

In order to facilitate resistive heating of the build material 102, one or more contact pads, probes or the like may be positioned within the feed path for the material in order to provide locations for forming a circuit through the material at the appropriate location(s). In order to facilitate induction heating, one or more electromagnets may be positioned at suitable locations adjacent to the feed path and operated, e.g., by the control system 118, to heat the build material internally through the creation of eddy currents. In one aspect, both of these techniques may be used concurrently to achieve a more tightly controlled or more evenly distributed electrical heating within the build material. The printer 100 may also be instrumented to monitor the resulting heating in a variety of ways. For example, the printer 100 may monitor power delivered to the inductive or resistive circuits. The printer 100 may also or instead measure temperature of the build material 102 or surrounding environment at any number of locations. In another aspect, the temperature of the build material 102 may be inferred by measuring, e.g., the amount of force required to drive the build material 102 through a nozzle 110 or other portion of the feed path, which may be used as a proxy for the viscosity of the build material 102. More generally, any techniques suitable for measuring temperature or viscosity of the build material 102 and responsively controlling applied electrical energy may be used to control liquefaction for a fabrication process using composites as described herein.

The liquefaction system 106 may also or instead include any other heating systems suitable for applying heat to the build material 102 to a suitable temperature for extrusion. This may, for example include techniques for locally or globally augmenting heating using, e.g., chemical heating, combustion, ultrasound heating, laser heating, electron beam heating or other optical or mechanical heating techniques and so forth.

The liquefaction system 106 may include a shearing engine. The shearing engine may create shear within the composite as it is heated in order to maintain a mixture of the metallic base and a binder or other matrix, or to maintain a mixture of various materials in a paste or other build material. A variety of techniques may be employed by the shearing engine. In one aspect, the bulk media may be axially rotated as it is fed along the feed path into the liquefaction system 106. In another aspect, one or more ultrasonic transducers may be used to introduce shear within the heated material. Similarly, a screw, post, arm, or other physical element may be placed within the heated media and rotated or otherwise actuated to mix the heated material. In an aspect, bulk build material may include individual pellets, rods, or coils (e.g., of consistent size) and fed into a screw, a plunger, a rod extruder, or the like. For example, a coiled build material can be uncoiled with a heater system including a heated box, heated tube, or heater from the print head. Also, a direct feed with no heat that feeds right into the print head is also possible.

The robotic system 108 may include a robotic system configured to three-dimensionally position the nozzle 110 within the working volume 115 of the build chamber 116. This may, for example, include any robotic components or systems suitable for positioning the nozzle 110 relative to the build plate 114 while depositing the composite in a pattern to fabricate the object 112. A variety of robotics systems are known in the art and suitable for use as the robotic system 108 described herein. For example, the robotics may include a Cartesian or xy-z robotics system employing a number of linear controls to move independently in the x-axis, the y-axis, and the z-axis within the build chamber 116. Delta robots may also or instead be usefully employed, which can, if properly configured, provide significant advantages in terms of speed and stiffness, as well as offering the design convenience of fixed motors or drive elements. Other configurations such as double or triple delta robots can increase range of motion using multiple linkages. More generally, any robotics suitable for controlled positioning of the nozzle 110 relative to the build plate 114, especially within a vacuum or similar environment, may be usefully employed including any mechanism or combination of mechanisms suitable for actuation, manipulation, locomotion and the like within the build chamber 116.

The nozzle(s) 110 may include one or more nozzles for dispensing the build material 102 that has been propelled with the drive train 104 and heated with the liquefaction system 106 to a suitable working temperature. In a multiphase extrusion this may include a working temperature above the melting temperature of the metallic base of the composite, or more specifically between a first temperature at which the metallic base melts and the second temperature (above the first temperature) at which a second phase of the composite remains inert.

The nozzles 110 may, for example, be used to dispense different types of material so that, for example, one nozzle 110 dispenses a composite build material while another nozzle 110 dispenses a support material in order to support bridges, overhangs, and other structural features of the object 112 that would otherwise violate design rules for fabrication with the composite build material. In another aspect, one of the nozzles 110 may deposit a different type of material, such as a thermally compatible polymer or a metal or polymer loaded with fibers of one or more materials to increase tensile strength or otherwise improve mechanical properties of the resulting object 112. In an aspect, two types of supports may be used—(1) build supports and (2) sinter supports—e.g., using different materials printed into the same part to achieve these supports, or to create a distinguishing junction between these supports and the part.

The nozzle 110 may preferably be formed of a material or combination of materials with suitable mechanical and thermal properties. For example, the nozzle 110 will preferably not degrade at the temperatures wherein the composite material is to be dispensed, or due to the passage of metallic particles through a dispensing orifice therein. While nozzles for traditional polymer-based fused filament fabrication may be made from brass or aluminum alloys, a nozzle that dispenses metal particles may be formed of harder materials, or materials compatible with more elevated working temperatures such as a high carbon steel that is hardened and tempered. Other materials such as a refractory metal (e.g. molybdenum, tungsten) or refractory ceramic (e.g. mullite, corundum, magnesia) may also or instead be employed. In some instances, aluminum nozzles may instead be used for MIM extrusion of certain MIM materials. In another aspect, a softer thermally conductive material with a hard, wear-resistant coating may be used, such as copper with a hard nickel plating.

In one aspect, the nozzle 110 may include one or more ultrasound transducers 130 as described herein. Ultrasound may be usefully applied for a variety of purposes in this context. In one aspect, the ultrasound energy may facilitate extrusion by mitigating clogging by reducing adhesion of a build material to an interior surface of the nozzle 110. A variety of energy director techniques may be used to improve this general approach. For example, a deposited layer may include one or more ridges, which may be imposed by an exit shape of the nozzle 110, to present a focused area to receive ultrasound energy introduced into the interface between the deposited layer and an adjacent layer.

In another aspect, the nozzle 110 may include an induction heating element, resistive heating element, or similar components to directly control the temperature of the nozzle 110. This may be used to augment a more general liquefaction process along the feed path through the printer 100, e.g., to maintain a temperature of the build material 102 during fabrication, or this may be used for more specific functions, such as declogging a print head by heating the build material 102 substantially above the working range, e.g., to a temperature where the composite is liquid. While it may be difficult or impossible to control deposition in this liquid state, the heating can provide a convenient technique to reset the nozzle 110 without more severe physical intervention such as removing vacuum to disassemble, clean, and replace the affected components.

In another aspect, the nozzle 110 may include an inlet gas or fan, e.g., an inert gas, to cool media at the moment it exits the nozzle 110. The resulting gas jet may, for example, immediately stiffen the dispensed material to facilitate extended bridging, larger overhangs, or other structures that might otherwise require support structures underneath.

The object 112 may be any object suitable for fabrication using the techniques described herein. This may include functional objects such as machine parts, aesthetic objects such as sculptures, or any other type of objects, as well as combinations of objects that can be fit within the physical constraints of the build chamber 116 and build plate 114. Some structures such as large bridges and overhangs cannot be fabricated directly using fused filament fabrication or the like because there is no underlying physical surface onto which a material can be deposited. In these instances, a support structure 113 may be fabricated, preferably of a soluble or otherwise readily removable material, in order to support the corresponding feature.

Where multiple nozzles 110 are provided, a second nozzle may usefully provide any of a variety of additional build materials. This may, for example, include other composites, alloys, bulk metallic glass's, thermally matched polymers and so forth to support fabrication of suitable support structures. In one aspect, one of the nozzles 110 may dispense a bulk metallic glass that is deposited at one temperature to fabricate a support structure 113, and a second, higher temperature at an interface to a printed object 112 where the bulk metallic glass can be crystallized at the interface to become more brittle and facilitate mechanical removal of the support structure 113 from the object 112. Conveniently, the bulk form of the support structure 113 can be left in the super-cooled state so that it can retain its bulk structure and be removed in a single piece. Thus in one aspect there is described herein a printer that fabricates a portion of a support structure 113 with a bulk metallic glass in a super-cooled liquid region, and fabricates a layer of the support structure adjacent to a printed object at a greater temperature in order to crystalize the build material 102 into a non-amorphous alloy. The bulk metallic glass particles may thus be loaded into a MIM feedstock binder system and may provide a support. Pure binding or polymer materials (e.g., without any loading) may also or instead provide a support. A similar metal MIM feedstock may be used for multi-material part creation. Ceramic or dissimilar metal MIM feedstock may be used for a support interface material.

Support Materials

In general, the MIM media includes a binder and a metal powder (or other material as described herein, such as ceramic powder). A support material may also be provided from a second nozzle consisting of, e.g., the binder used for the injection molding material, without the structural material that sinters into the final object. In another aspect, the support material may be formed of a wax, or some other thermoplastic or other polymer that can be removed during processing of a printed green body. This support material may, for example, be used for vertical supports, as well as for top or side supports, or any other suitable support structures to provide a physical support during printing and subsequent sintering. Printing and sintering may impose different support requirements. As such, different support materials and or different support rules may be employed for each type of required support. Additionally, the print supports may be removed after a print and before sintering, while sintering supports would be left attached to the green object until sintering is completed (or sufficiently completed to eliminate the need for the sintering support structures).

In another aspect, the second nozzle (or a third nozzle) may be used to provide an interface material that is different from the support material, such as the corresponding binder, along with a ceramic or some other material that will not sinter under the time and temperature conditions used to sinter the injection molding material. This may also or instead include a metal or the like that forms a brittle interface with the sintered part so that it can break away from the final object easily after sintering. Where this interface material does not sinter, it may be used in combination with a sinterable support structure that can continue to provide structural support during a sintering process.

The support material(s) may usefully integrate other functional substances. For example, titanium may be added to the support material as an oxygen getter to improve the build environment without introducing any titanium into the fabricated object. Other types of additives may also or instead be used to remove contaminants. For example, a zirconium powder (or other strong carbide former) may be added to the support material in order to extract carbon contamination during sintering.

Nested Parts

In one aspect, the use of non-structural support at the interface, e.g. a pure binder that does not sinter into a structural object, may be used to facilitate the additive manufacture of nested parts. For example, a complete gear box or the like may be fabricated within a enclosure, with the surfaces between gear teeth fabricated with a non-sintering binder or other material. In one aspect, critical mechanical interfaces for such mechanical parts may be oriented to the fabrication process, e.g., by orienting mating surfaces vertically so that smaller resolutions can be used. More generally, the capability to print adjacent, non-coupled parts may be used to fabricate multiple physically related parts in a single print job. This may, for example, include hinges, gears, captive bearings or other nested or interrelated parts. Non-sintering support material may be extracted, e.g., using an ultrasonicator, fluid cleaning, or other techniques after the object is sintered to a final form. In an aspect, the binder is loaded with a non-sintering additive such as ceramic or dissimilar, higher sintering temp metal.

This general approach may also affect the design of the part. For example, axles may employ various anti-backlash techniques so that the sintered part is more securely retained during movement and use. Similarly, fluid paths may be provided for fluid cleaning, and removal paths may be created for interior support structures. This technique may also be used to address other printing challenges. For example, support structures within partially enclosed spaces may be fabricated for removal through some removal path after the object is completed. If the support structures are weakly connected, or unconnected, to the fabricated object, they can be physically manipulated for extraction through the removal path. In an aspect, parts may be "glued" together with an appropriate (e.g., the same) MIM material to make larger parts that essentially have no joints once sintered.

The build plate 114 within the working volume 115 of the build chamber 116 may include a rigid and substantially planar surface formed of any substance suitable for receiving deposited composite or other material(s)s from the nozzles 110. In one aspect, the build plate 114 may be heated, e.g., resistively or inductively, to control a temperature of the build chamber 116 or the surface upon which the object 112 is being fabricated. This may, for example, improve adhesion, prevent thermally induced deformation or failure, and facilitate relaxation of stresses within the fabricated object. In another aspect, the build plate 114 may be a deformable build plate that can bend or otherwise physical deform in order to detach from the rigid object 112 formed thereon.

The build chamber 116 may be any chamber suitable for containing the build plate 114, an object 112, and any other components of the printer 100 used within the build chamber 116 to fabricate the object 112. In one aspect, the build chamber 116 may be an environmentally sealed chamber that can be evacuated with a vacuum pump 124 or similar device in order to provide a vacuum environment for fabrication. This may be particularly useful where oxygen causes a passivation layer that might weaken layer-to-layer bonds in a fused filament fabrication process as described herein, or where particles in the atmosphere might otherwise interfere with the integrity of a fabricated object, or where the build chamber 116 is the same as the sintering chamber. In another aspect, only oxygen is removed from the build chamber 116.

Similarly, one or more passive or active oxygen getters 126 or other similar oxygen absorbing material or system may usefully be employed within the build chamber 116 to take up free oxygen within the build chamber 116. The oxygen getter 126 may, for example, include a deposit of a reactive material coating an inside surface of the build chamber 116 or a separate object placed therein that completes and maintains the vacuum by combining with or adsorbing residual gas molecules. The oxygen getters 126, or more generally, gas getters, may be deposited as a support material using one of the nozzles 110, which facilitates replacement of the gas getter with each new fabrication run and can advantageously position the gas getter(s) near printed media in order to more locally remove passivating gasses where new material is being deposited onto the fabricated object. In one aspect, the oxygen getters 126 may include any of a variety of materials that preferentially react with oxygen including, e.g., materials based on titanium, aluminum, and so forth. In another aspect, the oxygen getters 126 may include a chemical energy source such as a combustible gas, gas torch, catalytic heater, Bunsen burner, or other chemical and/or combustion source that reacts to extract oxygen from the environment. There are a variety of low-CO and NOx catalytic burners that may be suitably employed for this purpose without CO.

In one aspect, the oxygen getter 126 may be deposited as a separate material during a build process. Thus in one aspect there is described herein a process for fabricating a three-dimensional object from a metallic composite including co-fabricating a physically adjacent structure (which may or may not directly contact the three-dimensional object) containing an agent to remove passivating gasses around the three-dimensional object. Other techniques may be similarly employed to control reactivity of the environment within the build chamber 116, or within post-processing chambers or the like as described below. For example, the build chamber 116 may be filled with an inert gas or the like to prevent oxidation.

The control system 118 may include a processor and memory, as well as any other co-processors, signal processors, inputs and outputs, digital-to-analog or analog-to-digital converters and other processing circuitry useful for monitoring and controlling a fabrication process executing on the printer 100. The control system 118 may be coupled in a communicating relationship with a supply of the build material 102, the drive train 104, the liquefaction system 106, the nozzles 110, the build plate 114, the robotic system 108, and any other instrumentation or control components associated with the build process such as temperature sensors, pressure sensors, oxygen sensors, vacuum pumps, and so forth. The control system 118 may be operable to control the robotic system 108, the liquefaction system 106 and other components to fabricate an object 112 from the build material 102 in three dimensions within the working volume 115 of the build chamber 116.

The control system 118 may generate machine ready code for execution by the printer 100 to fabricate the object 112 from the three-dimensional model 122. The control system 118 may deploy a number of strategies to improve the resulting physical object structurally or aesthetically. For example, the control system 118 may use plowing, ironing, planing, or similar techniques where the nozzle 110 runs over existing layers of deposited material, e.g., to level the material, remove passivation layers, apply an energy director topography of peaks or ridges to improve layer-to-layer bonding, or otherwise prepare the current layer for a next layer of material. The nozzle 110 may include a low-friction or non-stick surface such as Teflon, TiN or the like to facilitate this plowing process, and the nozzle 110 may be heated and/or vibrated (e.g., using an ultrasound transducer) to improve the smoothing effect. In one aspect, this surface preparation may be incorporated into the initially-generated machine ready code. In another aspect, the printer 100 may dynamically monitor deposited layers and determine, on a layer-by-layer basis, whether additional surface preparation is necessary or helpful for successful completion of the object.

In one aspect, the control system 118 may employ pressure or flow rate as a process feedback signal. While temperature is frequently the critical physical quantity for fabrication with thermoplastic binders, it may be difficult to accurately measure the temperature of a composite build material throughout the feed path. However, the temperature can be inferred by the viscosity of the build material, which can be estimated for the bulk material based on how much force is being applied to drive the material through a feed path. Thus in one aspect, there is described herein a printer that measures the force applied by a drive train to a composite such as any of the composites described above, infers a temperature of the build material based on the instantaneous force, and controls a liquefaction system to adjust the temperature accordingly.

In general, a three-dimensional model 122 of the object may be stored in a database 120 such as a local memory of a computer used as the control system 118, or a remote database accessible through a server or other remote resource, or in any other computer-readable medium accessible to the control system 118. The control system 118 may retrieve a particular three-dimensional model 122 in response to user input, and generate machine-ready instructions for execution by the printer 100 to fabricate the corresponding object 112. This may include the creation of intermediate models, such as where a CAD model is converted into an STL model or other polygonal mesh or other intermediate representation, which can in turn be processed to generate machine instructions for fabrication of the object 112 by the printer 100.

In another aspect, the nozzle 110 may include one or more mechanisms to flatten a layer of deposited material and apply pressure to bond the layer to an underlying layer. For example, a heated nip roller, caster, or the like may follow the nozzle 110 in its path through an x-y plane of the build chamber to flatten the deposited (and still pliable) layer. The nozzle 110 may also or instead integrate a forming wall, planar surface or the like to additionally shape or constrain a build material 102 as it is deposited by the nozzle 110. The nozzle 110 may usefully be coated with a non-stick material (which may vary according to the build material being used) in order to facilitate more consistent shaping and smoothing by this tool.

In another aspect, a layer fusion system 132 may be used to encourage good mechanical bonding between adjacent layers of deposited build material within the object 112. This may include the ultrasound transducers described above, which may be used to facilitate bonding between layers by applying ultrasound energy to an interface between layers during deposition. In another aspect, current may be passed through an interface between adjacent layers in order to Joule heat the interface and liquefy or soften the materials for improved bonding. Thus in one aspect, the layer fusion system 132 may include a joule heating system configured to apply a current between a first layer of the build material and a second layer of the build material in the working volume 115 while the first layer is being deposited on the second layer. In another aspect, the layer fusion system 132 may include an ultrasound system for applying ultrasound energy to a first layer of the build material while the first layer is being deposited onto a second layer of the build material in the working volume 115. In another aspect, the layer fusion system 132 may include a rake, ridge(s), notch(es) or the like formed into the end of the nozzle 110, or a fixture or the like adjacent to the nozzle, in order to form energy directors on a top surface of a deposited material. Other techniques may also or instead be used to improve layer-to-layer bonding, such as plasma cleaning or other depassivation before or during formation of the interlayer bond. The use of injection molding materials can alleviate many of the difficulties of forming layer-to-layer bonds with deposited metals, but these and other techniques may nonetheless be useful in improving interlayer bonds and/or shaping a fabricated object as described herein.

During fabrication, detailed data may be gathered for subsequent use and analysis. This may, for example, include a camera and computer vision system that identifies errors, variations, or the like that occur in each layer of an object. Similarly, tomography or other imaging techniques may be used to detect and measure layer-to-layer interfaces, aggregate part dimensions, diagnostic information (e.g., defects, voids) and so forth. This data may be gathered and delivered with the object to an end user as a digital twin 140 of the object 112 so that the end user can evaluate whether and how variations and defects might affect use of the object 112. In addition to spatial/geometric analysis, the digital twin 140 may log process parameters including, for example, aggregate statistics such as weight of material used, time of print, variance of build chamber temperature, and so forth, as well as chronological logs of any process parameters of interest such as volumetric deposition rate, material temperature, environment temperature, and so forth.

The printer 100 may include a camera 150 or other optical device. In one aspect, the camera 150 may be used to create the digital twin 140 described above, or to more generally facilitate machine vision functions or facilitate remote monitoring of a fabrication process. Video or still images from the camera 150 may also or instead be used to dynamically correct a print process, or to visualize where and how automated or manual adjustments should be made, e.g., where an actual printer output is deviating from an expected output.

The printer 100 may also usefully integrate a subtractive fabrication tool 160 such as a drill, milling bit, or other multi-axis controllable tool for removing material from the object 112 that deviates from an expected physical output based on the 3D model 122 used to fabricate the object 112. While combinations of additive and subtractive technologies have been described, the use of MIM materials provides a unique advantage when subtractive shaping is performed on a green object after net shape forming but before sintering (or debinding), when the object 112 is relatively soft and workable. This permits quick and easy removal of physically observable defects and printing artifacts before the object 112 is sintered into a metal object. An aspect may instead include tapping threads or otherwise adding features as opposed to subtracting parts. Similarly, an aspect may include combining multiple single green parts into one larger fully solid sintered part.

Other useful features may be integrated into the printer 100 described above. For example, a solvent or other material may be usefully applied a surface of the object 112 during fabrication to modify its properties. This may, for example intentionally oxidize or otherwise modify the surface at a particular location or over a particular area in order to provide a desired electrical, thermal optical, or mechanical property. This capability may be used to provide aesthetic features such as text or graphics, or to provide functional features such as a window for admitting RF signals.

Figure 2:
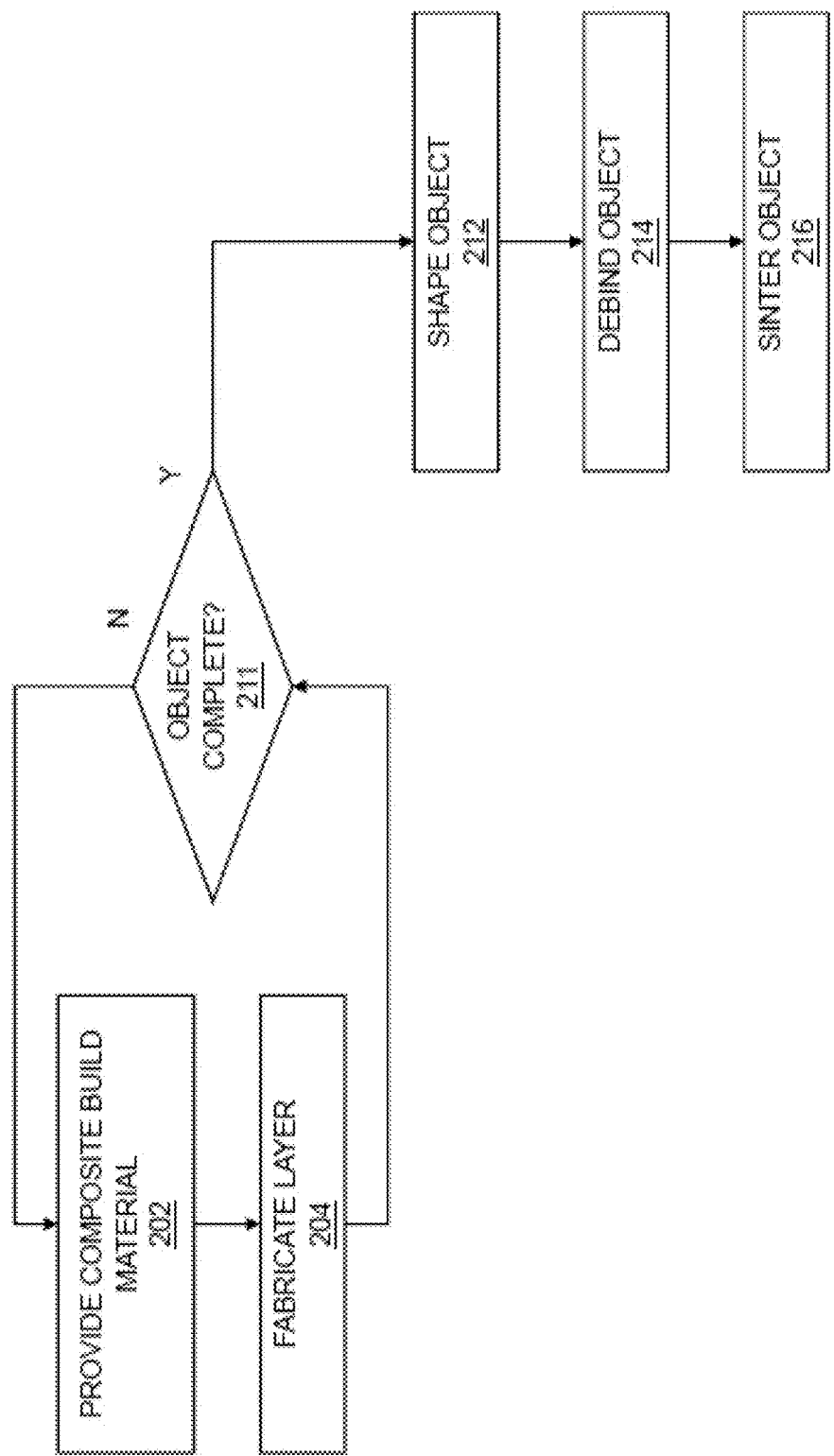
FIG. 2 is a flow chart of a method for printing with composites.

FIG. 2 shows a flow chart of a method for printing with composites, e.g., metal injection molding materials. As shown in step 202, the process 200 may include providing a build material including an injection molding material, or where a support interface is being fabricated, a MIM binder (e.g., a MIM binder with similar thermal characteristics). The material may include, for example, any of the MIM materials described herein. The material may be provided as a build material in a billet, a wire, or any other cast, drawn, extruded or otherwise shaped bulk form. As described above, the build material may be further packaged in a cartridge, spool, or other suitable carrier that can be attached to an additive manufacturing system for use.

As shown in step 204, the process may include fabricating a layer of an object. This may include any techniques that can be adapted for use with MIM materials. For example, this may include fused filament fabrication, jet printing or any other techniques for forming a net shape from a MIM material (and more specifically for techniques used for forming a net shape from a polymeric material loaded with a second phase powder).

As shown in step 211, this process may be continued and repeated as necessary to fabricate an object within the working volume. While the process may vary according to the underlying fabrication technology, an object can generally be fabricated layer by layer based on a three-dimensional model of the desired object. As shown in step 212, the process 200 may include shaping the net shape object after the additive process is complete. Before debinding or sintering, the green body form of the object is usefully in a soft, workable state where defects and printing artifacts can be easily removed, either manually or automatically. Thus the process 200 may take advantage of this workable, intermediate state to facilitate quality control or other process-related steps, such as removal of supports that are required for previous printing steps, but not for debinding or sintering.

As shown in step 214, the process 200 may include debinding the printed object. In general debinding may be performed chemically or thermally to remove a binder that retains a metal (or ceramic or other) powder in a net shape. Contemporary injection molding materials are often engineered for thermal debinding, which advantageously permits debinding and sintering to be performed in a single baking operation, or in two similar baking operations. In general, the debinding process functions to remove binder from the net shape green object, thus leaving a very dense structure of metal (or ceramic or other) particles that can be sintered into the final form.

As shown in step 216, the process 200 may include sintering the printed and debound object into a final form. In general, sintering may be any process of compacting and forming a solid mass of material by heating without liquefaction. During a sintering process, atoms can diffuse across particle boundaries to fuse into a solid piece. Because sintering can be performed at temperatures below the melting temperature, this advantageously permits fabrication with very high melting point materials such as tungsten and molybdenum.

Numerous sintering techniques are known in the art, and the selection of a particular technique may depend upon the build material used, and the desired structural, functional or aesthetic result for the fabricated object. For example, in solid-state (non-activated) sintering, metal powder particles are heated to form connections (or "necks") where they are in contact. Over time, these necks thicken and create a dense part, leaving small, interstitial voids that can be closed, e.g., by hot isostatic pressing (HIP) or similar processes. Other techniques may also or instead be employed. For example, solid state activated sintering uses a film between powder particles to improve mobility of atoms between particles and accelerate the formation and thickening of necks. As another example, liquid phase sintering may be used, in which a liquid forms around metal particles. This can improve diffusion and joining between particles, but also may leave lower-melting phase within the sintered object that impairs structural integrity. Other advanced techniques such as nano-phase separation sintering may be used, for example to form a high-diffusivity solid at the necks to improve the transport of metal atoms at the contact point Debinding and sintering may result in material loss and compaction, and the resulting object may be significantly smaller than the printed object. However, these effects are generally linear in the aggregate, and net shape objects can be usefully scaled up when printing to create a corresponding shape after debinding and sintering.

Figure 3:
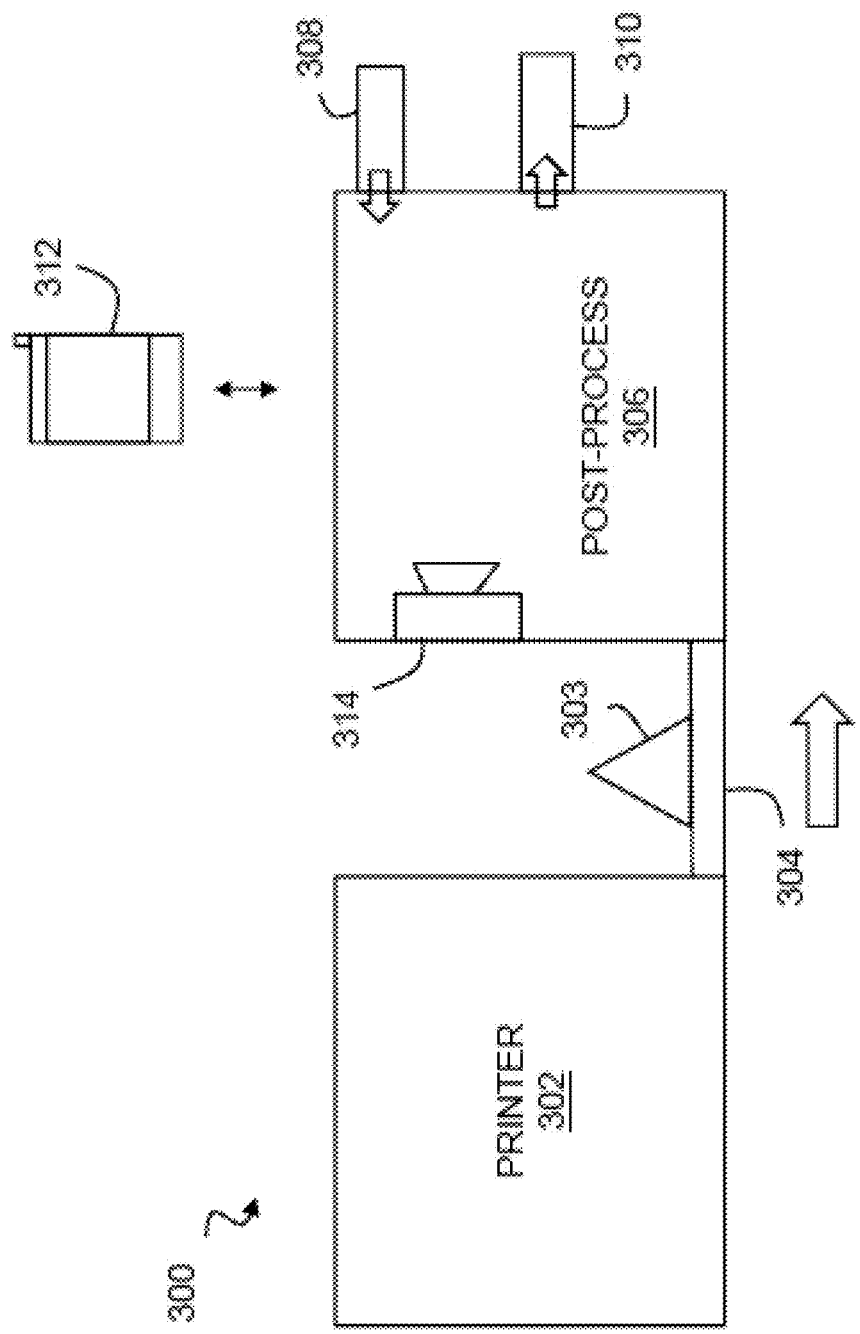
FIG. 3 illustrates an additive manufacturing system for use with metal injection molding materials.

FIG. 3 shows an additive manufacturing system for use with metal injection molding materials. The system 300 may include a printer 302, a conveyor 304, and a post-processing station 306. In general, the printer 302 may be any of the printers described above including, for example a fused filament fabrication system, a stereolithography system, a selective laser sintering system, or any other system that can be usefully adapted to form a net shape object under computer control using injection molding build materials. The output of the printer 302 may be an object 303 that is a green body including any suitable powder (e.g., metal, metal alloy, ceramic, and so forth, as well as combinations of the foregoing), along with a binder that retains the powder in a net shape produced by the printer 302.

The conveyor 304 may be used to transport the object 303 from the printer 302 to a post-processing station 306 where debinding and sintering can be performed. The conveyor 304 may be any suitable device or combination of devices suitable for physically transporting the object 303. This may, for example, include robotics and a machine vision system or the like on the printer side for detaching the object 303 from a build platform or the like, as well as robotics and a machine vision system or the like on the post-processing side to accurately place the object 303 within the post-processing station 306. Further, the post-processing station 306 may serve multiple printers so that a number of objects can be debound and sintered concurrently, and the conveyor 304 may interconnect the printers and post-processing station so that multiple print jobs can be coordinated and automatically completed in parallel. Alternatively, the object 303 may be manually transported between the two corresponding stations.

The post-processing station 306 may be any system or combination of systems useful for converting a green part formed into a desired net shape from a metal injection molding build material by the printer 302 into a final object. The post-processing station 306 may, for example, include a chemical debinding station and a thermal sintering station that can be used in sequence to produce a final object. Some contemporary injection molding materials are engineered for thermal debinding, which makes it possible to perform a combination of debinding and sintering steps with a single oven or similar device. While the thermal specifications of a sintering furnace may depend upon the powder to be sintered, the binder system, the loading, and other properties of the green object and the materials used to manufacture same, commercial sintering furnaces for thermally debound and sintered MIM parts may typically operate with an accuracy of +/−5 degrees Celsius or better, and temperatures of at least 600 degrees C., or from about 200 degrees C. to about 1900 degrees C. for extended times. Any such furnace or similar heating device may be usefully employed as the post-processing station 306 as described herein. Vacuum or pressure treatment may also or instead be used. Identical or similar material beads with a non-binding coating may be used for a furnace support—e.g., packing in a bed of this material that shrinks similar to the part, except that it will not bond to the part.

Embodiments may be implemented with a wide range of other debinding and sintering processes. For example, the binder may be removed in a chemical debind, thermal debind, or some combination of these. Other debinding processes are also known in the art (such as supercritical or catalytic debinding), any of which may also or instead be employed by the post-processing station 306 as described herein. For example, in a common process, a green part is first debound using a chemical debind, which is following by a thermal debind at a moderately high temperature (in this context, around 700-800 C) to remove organic binder and create enough necks among a powdered material to permit handling. From this stage, the object may be moved to a sintering furnace to remove any remaining components of a binder system densify the object. Alternatively, a pure thermal debind may be used to remove the organic binder. More general, any technique or combination of techniques may be usefully employed to debind an object as described herein.

Similarly, a wide range of sintering techniques may be usefully employed by the post-processing station. For example, an object may be consolidated in a furnace to a high theoretical density using vacuum sintering. Alternatively, the furnace may use a combination of flowing gas (e.g., at below atmosphere, slightly above atmosphere, or some other suitable pressure) and vacuum sintering. More generally, any sintering or other process suitable for improving object density may be used, preferably where the process yields a near-theoretical density part with little or no porosity. Hot-isostatic pressing ("HIP") may also (e.g., as a post sinter finishing step) or instead be employed, e.g., by applying elevated temperatures and pressures of 10-50 ksi, or between about 15 and 30 ksi. Alternatively, the object may be processed using any of the foregoing, followed by a moderate overpressure (greater than the sintering pressure, but lower than HIP pressures). In this latter process, gas may be pressurized at 100-1500 psi and maintained at elevated temperatures within the furnace or some other supplemental chamber. Alternatively, the object may be separately heated in one furnace, and then immersed in a hot granular media inside a die, with pressure applied to the media so that it can be transmitted to the object to drive more rapid consolidation to near full density. More generally, any technique or combination of techniques suitable for removing binder systems and driving a powdered material toward consolidation and densification may be used by the post-processing station 306 to process a fabricated green part as described herein.

The post-processing station 306 may be incorporated into the printer 302, thus removing a need for a conveyor 304 to physically transport the object 303. The build volume of the printer 302 and components therein may be fabricated to withstand the elevated debinding/sintering temperatures. Alternatively, the printer 302 may provide movable walls, barriers, or other enclosure(s) within the build volume so that the debind/sinter can be performed while the object 303 is on a build platform within the printer 302, but thermally isolated from any thermally sensitive components or materials.

The post-processing station 306 may be optimized in a variety of ways for use in an office environment. The post-processing station 306 may include an inert gas source 308. The inert gas source 308 may, for example, include argon or other inert gas (or other gas that is inert to the sintered material), and may be housed in a removable and replaceable cartridge that can be coupled to the post-processing station 306 for discharge into the interior of the post-processing station 306, and then removed and replaced when the contents are exhausted. The post-processing station 306 may also or instead include a filter 310 such as a charcoal filter or the like for exhausting gasses that can be outgassed into an office environment in an unfiltered form. For other gasses, an exterior exhaust, or a gas container or the like may be provided to permit use in unventilated areas. For reclaimable materials, a closed system may also or instead be used, particularly where the environmental materials are expensive or dangerous.

The post-processing station 306 may be coupled to other system components. For example, the post-processing station 306 may include information from the printer 302, or from a controller for the printer, about the geometry, size, mass and other physical characteristics of the object 303 in order to generate a suitable debinding and sintering profile. Optionally, the profile may be created independently by the controller or other resource and transmitted to the post-processing station 306 when the object 303 is conveyed. Further, the post-processing station 306 may monitor the debinding and sintering process and provide feedback, e.g., to a smart phone or other remote device 312, about a status of the object, a time to completion, and other processing metrics and information. The post-processing station 306 may include a camera 314 or other monitoring device to provide feedback to the remote device 312, and may provide time lapse animation or the like to graphically show sintering on a compressed time scale. Post-processing may also or instead include finishing with heat, a hot knife, tools, or similar, and may include applying a finish coat.

In general, a fabrication process such as fused filament fabrication implies, or expressly includes, a set of design rules to accommodate physical limitations of a fabrication device and a build material. For example, a horizontal shelf cannot be fabricated without positioning a support structure underneath. While the design rules for FFF may apply to fabrication of a green body using FFF techniques as described herein, the green body may also be subject to various MIM design rules. This may, for example, include a structure to prevent or minimize drag on a floor while a part shrinks during sintering which may be 20% or more depending on the composition of the green body. Similarly, certain supports are required during sintering that are different than the supports required during fused filament fabrication. As another example, injection molding typically aims for uniform wall thickness to reduce variability in debinding and/or sintering behaviors, with thinner walls being preferred. Example embodiments described herein may apply to disparate sets of design rules to a CAD model that is being prepared for fabrication. Such disparate design rules may include those for a rapid prototyping system (e.g., fused filament fabrication), and those for the sintering process (e.g., MIM design rules).

These rules may also be combined under certain conditions. For example, the support structures for a horizontal shelf during fabrication must resist the force of an extrusion/deposition process used to fabricate the horizontal shelf, whereas the support structure during sintering only needs to resist the forces of gravity during the baking process. Thus there may be two separate supports that are removed at different times during a fabrication process: the fabrication supports that are configured to resist the force of a fabrication process and may be breakaway supports that are loosely mechanically coupled to a green body, along with sintering supports that may be less extensive, and only need to resist the gravitation forces on a body during sintering. These latter supports are preferably coupled to the object through a non-sinterable layer to permit easy removal from the densified final object. In another aspect, the fabrication supports may be fabricated from binder without a powder or other fill so that they completely disappear during a sintering process.

Figure 4:
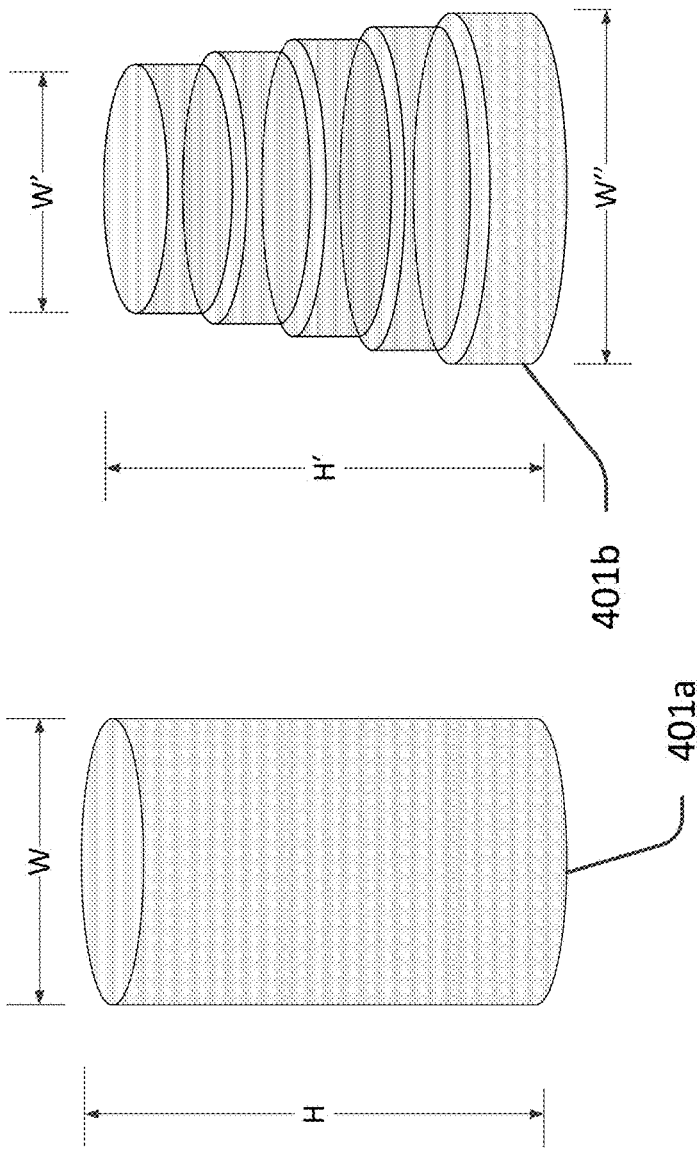
FIG. 4 illustrates a printed object prior to and after post-print processing.

FIG. 4 illustrates an example object that may be produced by an additive manufacturing system as described above with reference to FIGS. 1-3. The object, a cylinder, is illustrated at two stages of the manufacturing process: a post-print, "green" object 401a, illustrating the state of the object following printing by a printer (e.g., printer 100); and a post-processing object 401b, illustrating the object following post-processing, such as debinding and/or sintering.

During the processes of debinding and sintering an object following a print, different regions of the object may compress or shrink by different amounts relative to one another. The pressure or stress on a given regions of an object may be one factor that influences said different amount of compression or shrinkage in said region. In a simplified model, the stress in any one region may be a function of the cross-section of the region in the horizontal (XY) plane, as well as the weight of material above the region being supported. In a more sophisticated model, a finite element package may be run to determine the stress due to gravitational effects as a function of position throughout the part. The differing levels of stress throughout the object may cause different local amounts of compression or shrinkage during debinding and/or sintering, resulting in deformation (in the case of high temperatures and/or prolonged times, this deformation is often referred to as creep) and lower fidelity to the intended geometry of the object. For example, the object after post-processing (post-processing object) 401b exhibits particular deformations relative to the post-print object 401a. Specifically, where the post-print object 401a has a height H and width W (corresponding to the diameter), the post-processing object 401b has a height H', which is less than H due to gravitational forces and/or shrinking caused by a sintering process. The shape of the object 401b also differs from the object 401a, exhibiting a slope between the top and bottom ends, resulting in a different, smaller top width W' and a larger bottom width W". Such deformation may result from stresses of different magnitudes at respective layers of the object. For example, gravity-induced compression from the upper layers of the object may cause the lower layers of the object 401b to deform outward and downward. Such deformation may partially separate or otherwise laterally deform individual sections of the part such that at the outer bounds of the part a "staircase" or slope may develop—even on nominally vertical surfaces as shown. The deformation of the object 401b is not drawn to scale, but drawn for illustrative purposes. It should be recognized that in many cases, the shrinkage of the object due to sintering may be substantially larger than the deformation of the object due to such non-uniform deformations, but that these effects may be usefully superposed to achieve an accurate object. The deformation of object 401b is drawn to emphasize the non-uniform deformations, and may therefore not be representative of all uniform or otherwise affine shape transformations.

A system may compensate for shrinkage due to sintering by applying uniform scaling to the object when printed. The printer thus prints a green part that is larger in all dimensions (e.g., 105% of the target object dimensions). The part may in some instances be scaled uniformally by different amounts in different directions. The green part may then be sintered (following an optional debinding). During sintering, the part may shrink to produce a finished part that approximates the target dimensions of the object. However, as described above, sintering and other post-processing may not cause uniform shrinkage of the green part. An approach of uniform scaling does not account for the non-uniform deformations of the object during post-processing, and may result in a finished part with low fidelity to the target part geometry.

In one embodiment, the stress or other factors related to non-uniform part deformation on each portion of the object may be calculated or otherwise predicted prior to printing the object, and the printer may then print the object in a manner that compensates for the predicted deformation resulting from the stress. As a result, the printed object may exhibit predicted changes in size and shape during post-processing, resulting in a final part having a higher fidelity to the target part geometry.

Figure 5:
FIG. 5 is a flow diagram illustrating a process in one embodiment.
Figure 6:
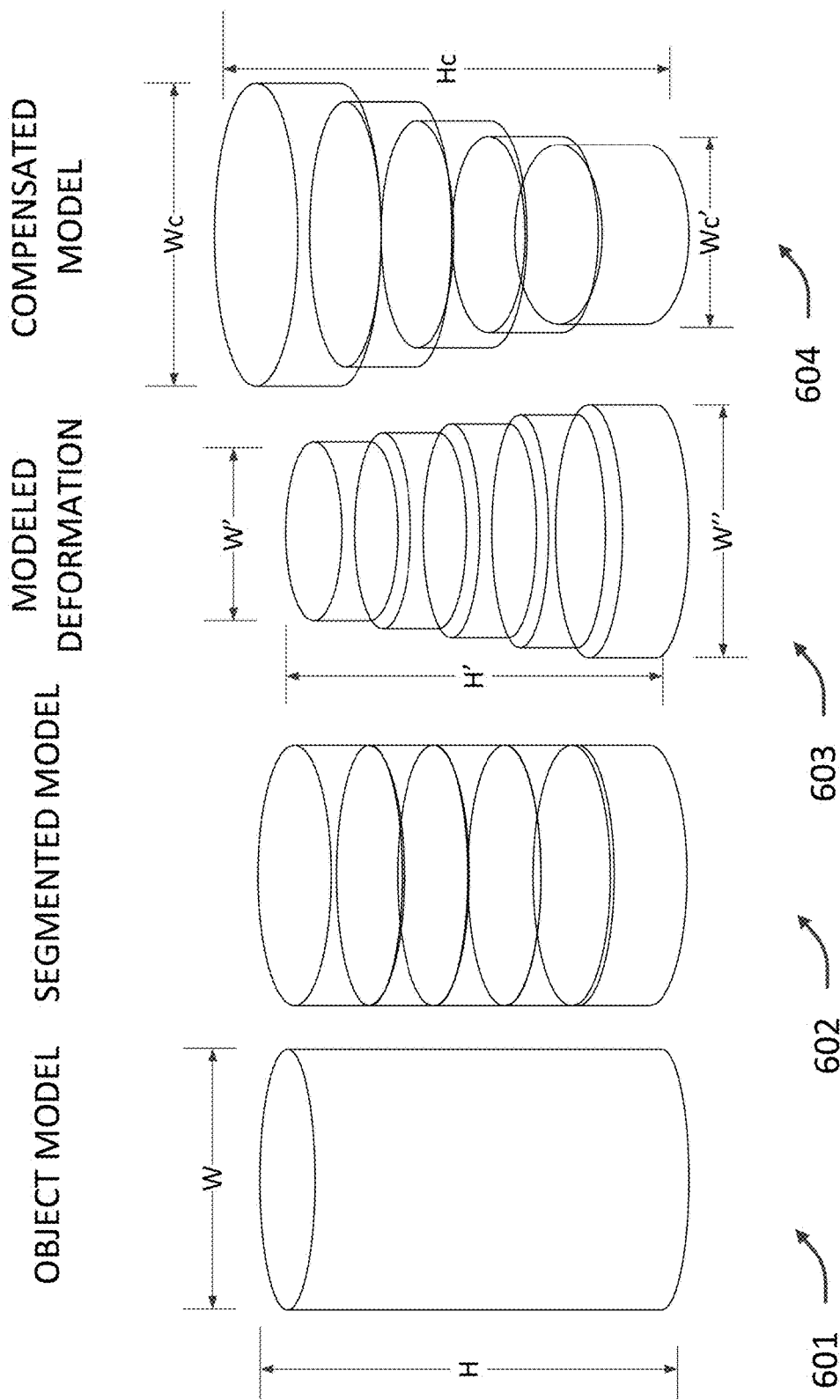
FIG. 6 illustrates object models in one embodiment.

FIG. 5 is a flow diagram of a process in an example embodiment. With reference to FIG. 6, and initial object model 601, which may define the desired geometry of a finished printed part, may be divided into a number of modeled segments as shown in the segmented model 602 (505). The example segmented model 602 is divided into several horizontal slices. Each slice of the model 602 may have a uniform thickness in the Z-direction, or may have a thickness dependent on slice/object geometry or predicted mass. Alternatively, the object model may be divided into segments of other geometry (e.g., cubes, prisms, etc.).

Following division into segments, each segment may then be processed to calculate a predicted deformation of the segment. For example, the average cross-sectional area (e.g., in XY plane) may be determined (510), and the weight of the material that resides above the segment may also be determined (515). Based on the above values, a predicted measure of stress on the segment may be calculated (520) (e.g. as the force exerted by gravity on the mass above the segment divided by the area of the segment $$\sigma = \frac{\rho g m}{A},$$

where $\rho$ is the density, g is the acceleration due to gravity, m is the mass, A is the segment area, and $\sigma$ is the computed stress). From the predicted measure of stress, a predicted deformation (e.g., compression, expansion, creep) of the segment as a result of the stress may be further calculated (525). An example model 603 illustrates the predicted deformation of the object model 601 on a per-segment basis. Based on the predicted deformation, a modified geometry of each segment may be calculated, where the modified geometry compensates for the predicted compression (530). This modified geometry may include scaling the mesh geometry in the X, Y, and Z directions due to the deformation, as well as scaling to compensate for shrinkage in the X, Y and Z directions due to a sintering process.

Utilizing the modified geometry for each segment, the parameters and commands used to print the object (print parameter for the object) may be modified accordingly (535). For example, the object model used for determining tool paths of the printer may be modified to correspond to the modified geometry, as illustrated by the compensated model 604. The compensated model 604 may exhibit for example, a height Hc that is greater than the height H of the initial object model 601 to compensate for vertical compression due to gravitational forces and/or vertical shrinkage due to sintering, Further, the compensated model 604 may exhibit top and bottom widths Wc and Wc' that differ from one another, and may be greater or less than the width W of the initial model 601 to compensate for horizontal expansion and/or contraction due to gravitational forces, other stresses, and/or sintering. Additional adjustments to the compensated model may be made to ensure artificial seams are not created between the segments. The object may then be printed based on the compensated model or other modified print parameters. During subsequent debinding and sintering, the modified geometry of the printed object may compensate for the stresses causing deformation of the object, thereby resulting in a finished object having higher fidelity to the desired object geometry (e.g., the geometry of the initial model 601).

In further embodiments, additional factors may be considered in generating the modified geometry, including the moment created by the relative location of the center of gravity of the weight above a segment relative to the center of gravity of the segment. This center of gravity may cause different amounts of compression (or, in some cases, expansion) within the segment.

An example process for generating modified print parameters is as follows. Beginning with an initial object model (e.g., model 601), static stresses on the model due to gravity may be computed (e.g., via finite element methods). The primary stresses that occur due to gravity are compressive in the vertical direction, although, for some complex structures, the stresses may have components in other directions. Although some embodiments may compensate solely for larger shrinkage rates in the vertical direction, embodiments may also compensate compressive deformation (e.g., widening segments of the object).

Deformation of the object may be empirically modeled. Many of the deformation mechanisms relevant to creep in powder metallurgy are linear with respect to time and stress. Thus, with a limited number of tests, one can calibrate the rate of creep for several representative stress states (e.g., via measuring displacement of fiducials in a compressively loaded column). With the approximation that creep is proportional to the stress in a given location, strain may be expressed as:

$$\epsilon_{ij}(x,y,z) = k \sigma_{ij}(x,y,z)$$

Where $\epsilon_{ij}(x, y, z)$ is a strain in the ij direction, and is function of position in the object, x,y,z, k is an empirically-determined constant, and $\sigma_{ij}(x, y, z)$ is the position-dependent stress-tensor of the object computed in the first step. $\epsilon_{ij}(x, y, z)$ is a deformation as a function of position that occurs due to the stresses applied to the sample. Applying the negative of this deformation to the sample (e.g. $-\epsilon_{ij}(x, y, z)$) will usefully increase geometric fidelity of the process after debinding and sintering.

It will be appreciated that in some embodiments, one may directly compute the compensated model without computing the distorted model, first. For example, the stress tensor may take a form which is easily inverted. In such cases, one may directly compute the inverse of the creep stress tensor, and directly compute the compensation of the model without explicitly computing the deformation prior.

In another aspect, the one may analytically and continuously compute the stresses in the part throughoutt known exact or approximate analytical solutions for stress fields due to distributed loads. This method of stress computation is distinct from discretized methods of calculating stresses, such as the finite element method or the discretizing the part into layers, and computing compressive stresses on a layer-by-layer basis. It will be appreciated that either discrete or continuous methods for calculation of stresses or the direct calculation of deformations may be usefully employed depending on the type of geometry to be analyzed and the accuracy of the calculation needed for the type of geometry and part being addressed.

Deformation of the object may be physically modeled: A strain due to creep via a creep law applied to the representative thermal cycle may be predicted. A general expression may include all possible creep laws. An example creep law may have the form:

$$\frac{d\epsilon}{dt} = \frac{C\sigma^m}{d^b} e^{-Q/k_B T}$$

Where $\epsilon$ is strain induced from creep, C is a material and mechanism-dependent constant, d is the grain size of the material, $\sigma$ is the stress computed in the prior step, m and b are exponents dependent upon the creep mechanism, Q is the activation energy, $k_B$ is Boltzmann's constant, and T is the absolute temperature. A predicted strain in a given segment may then have the form (wherein the stress, temperature, and grain size are considered to be a function of temperature):

$$\epsilon_{creep} = \int \frac{d\epsilon(t)}{dt} = \int_{t=0}^{t=end\ of\ thermal\ cycle} \frac{C\sigma(t)^m}{d(t)^b} e^{-\frac{Q}{k_B T(t)}} dt$$

As multiple mechanisms of creep can occur, the above may be extended to account for multiple mechanisms:

$$\epsilon_{creep} = \int \sum_{creep\ mechanism\ i} \frac{d\epsilon_i(t)}{dt} dt =$$

$$\int_{t=0}^{t=end\ of\ thermal\ cycle} \sum_{creep\ mechanism\ i} \frac{C_i \sigma(t)^{m_i}}{d(t)^{b_i}} e^{-\frac{Q_i}{k_B T(t)}} dt$$

The same approach for summation of strains due to multiple creep mechanisms may also be used to account for multiple deformation mechanisms, generally, or for deformations that occur during multiple processing steps. For example, in a printing process that involves printing, debinding, and sintering an object, the deformations predicted to occur may be usefully modelled individually and superposed to provide a printed shape of an object of generally higher tolerances than would otherwise be able to be produced.

Computing $\epsilon_{creep,ij}(x, y, z)$ in the same manner as in the above panel based on the position-dependent stress field will yield the predicted distortion of a part during debinding and sintering, applying the negative of this deformation may generally increase accuracy.

Utilizing the deformations modeled according to the process above, the initial object model may be modified to compensate for the modeled deformations. Print parameters may then be configured based on the modified object model.

Figures 7A, 7B:
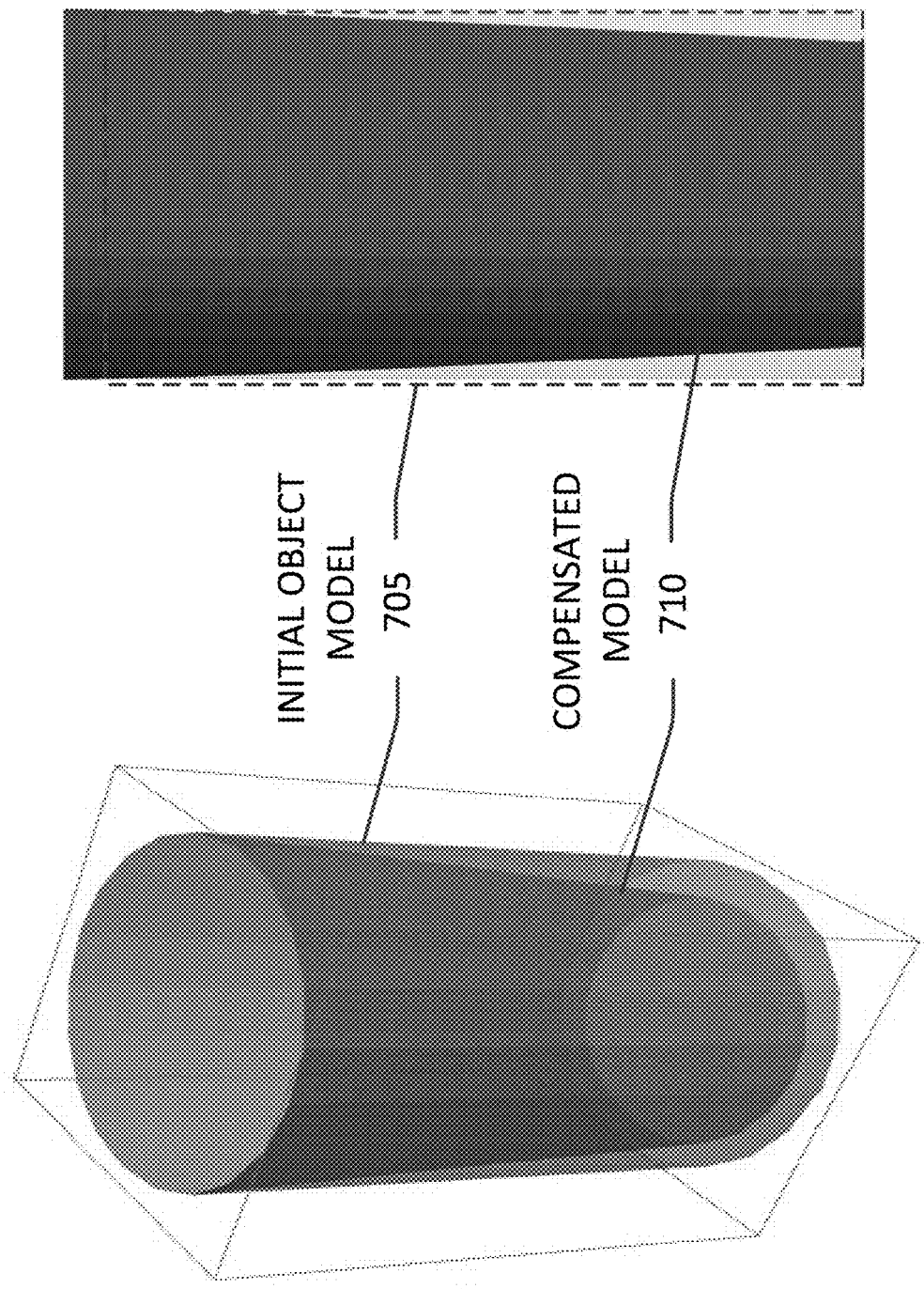
FIGS. 7A-B illustrates an object model in a further embodiment.

FIGS. 7A-B illustrate object models in a further embodiment. FIG. 7A is a perspective view of an initial object model 705 and a compensated model 710, while FIG. 7B is a front view of the models 705, 710. The initial model 705, while the compensated model 710 may correspond to print parameters for printing an object consistent with the geometry of the initial model 705 following post-print processing. As shown, the compensated model 710 exhibits a slope whereby the bottom diameter is smaller than the top diameter, as well as smaller than the bottom diameter of the initial model 705. Following a post-print process (e.g., sintering), a part printed according to the compensated model 710 may undergo geometric transformation, resulting in a finished part having a geometry matching or closely approximating that of the initial model. The compensated model 710 may be calculated from the initial object model 705 through a process as described above.

The above systems, devices, methods, processes, and the like may be realized in hardware, software, or any combination of these suitable for a particular application. The hardware may include a general-purpose computer and/or dedicated computing device. This includes realization in one or more microprocessors, microcontrollers, embedded microcontrollers, programmable digital signal processors or other programmable devices or processing circuitry, along with internal and/or external memory. This may also, or instead, include one or more application specific integrated circuits, programmable gate arrays, programmable array logic components, or any other device or devices that may be configured to process electronic signals. Further, a realization of the processes or devices described above may include computer-executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software. In another aspect, the methods may be embodied in systems that perform the steps thereof, and may be distributed across devices in a number of ways. At the same time, processing may be distributed across devices such as the various systems described above, or all of the functionality may be integrated into a dedicated, standalone device or other hardware. In another aspect, means for performing the steps associated with the processes described above may include any of the hardware and/or software described above.

Embodiments described herein may include computer program products comprising computer-executable code or computer-usable code that, when executing on one or more computing devices, performs any and/or all of the steps thereof. The code may be stored in a non-transitory fashion in a computer memory, which may be a memory from which the program executes (such as random access memory associated with a processor), or a storage device such as a disk drive, flash memory or any other optical, electromagnetic, magnetic, infrared or other device or combination of devices. In another aspect, any of the systems and methods described above may be embodied in any suitable transmission or propagation medium carrying computer-executable code and/or any inputs or outputs from same.

While this invention has been particularly shown and described with references to example embodiments thereof, it will be understood by those skilled in the art that various changes in form and details may be made therein without departing from the scope of the invention encompassed by the appended claims.

What is claimed is:

1. A method of printing an object, comprising:
   dividing an object model into a plurality of slices with a thickness in a Z-direction, the model defining a first geometry of the object;
   for each of the plurality of slices:
     calculating, for each of the plurality of slices, a measure of stress using a cross-sectional area of the slice and calculated weight of material residing atop the slice according to $$\sigma = \frac{g \cdot m_{above\ segment}}{A_{segment}};$$

and
predicting a deformation upon the slice will occur according to the measure of stress as a result of a sintering process following deposition of all the layers;
calculating a modified geometry for the slice, the modified geometry compensating for the deformation;
calculating a second geometry of the object from the collective of the modified geometries for each of the slices, the second geometry corresponding to a print geometry for the object; and
printing the object based on the second geometry.

2. The method of claim 1, wherein the weight of material corresponds to weight of all material residing atop said slice.

3. The method of claim 1, wherein the measured stress is associated with a corresponding compression force.

4. The method of claim 3, wherein the corresponding compression force is associated with the deformation.

5. The method of claim 1, wherein the measure of stress is calculated based on a location of a center of gravity of slices located above the slice.

6. The method of claim 1, wherein before the printing step, the method further comprises generating a correction model of the object.

7. The method of claim 6, wherein the correction model defines the modified print geometry of the object.

8. The method of claim 1, wherein the printing comprises extruding feedstock.

9. The method of claim 8, wherein the feedstock is extruded at a temperature between 160-250 degrees Celsius.

10. A method of printing an object, comprising:
dividing an object model into a plurality of slices with a thickness in a Z-direction, the object model defining a first geometry of the object;
calculating, for each slice from the plurality of slices:
a cross-sectional area in an X-Y plane;
a weight of material residing atop each slice;
a measure of stress using the calculated cross-sectional area and the calculated weight of material residing atop each slice according to $$\sigma = \frac{g \cdot m_{above\ segment}}{A_{segment}};$$

and
a predicted compression force upon the slice resulting from the measure of stress;
determining, based on the predicted compression force, a deformation predicted to occur as a result of a sintering process following deposition of all of the layers;
calculating a modified geometry for each slice, wherein the modified geometry compensates for the predicted deformation;
calculating a second geometry of the object from the collective of the modified geometries for each of the slices, the second geometry corresponding to a print geometry for the object; and
printing the object based on the second geometry.

11. The method of claim 10, wherein the weight of material corresponds to weight of all material residing atop said slice.

12. The method of claim 11, wherein the corresponding compression force is associated with the deformation.

13. The method of claim 10, wherein the measure of stress is calculated based on a location of a center of gravity of slices located above the slice.

14. The method of claim 10, wherein the calculating for each slice further comprises quantifying a predicted loss of dimensional stability in debinding, due to loading.

15. The method of claim 10, wherein before the printing step, the method further comprises generating a correction model of the object.

16. The method of claim 15, wherein the correction model defines the modified print geometry of the object.

17. The method of claim 10, wherein the printing comprises extruding feedstock.

18. The method of claim 17, wherein the feedstock is extruded at a temperature between 160-250 degrees Celsius.

* * * * *